(12) United States Patent
Teng et al.

(10) Patent No.: US 9,036,303 B2
(45) Date of Patent: May 19, 2015

(54) SUSPENSION WITH DIVIDED POSITIVE AND NEGATIVE WRITE TRACE SECTIONS, AND HEAD GIMBAL ASSEMBLY AND DISK DRIVE UNIT WITH THE SAME

(75) Inventors: Zhao yu Teng, DongGuan (CN); Chong xi Song, DongGuan (CN); Yun Zhang, DongGuan (CN); Yan Liu, DongGuan (CN); Xing hong Li, DongGuan (CN); Ming bing Huang, DongGuan (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 0 days.

(21) Appl. No.: 13/548,586

(22) Filed: Jul. 13, 2012

(65) Prior Publication Data

US 2013/0329320 A1    Dec. 12, 2013

(30) Foreign Application Priority Data

Jun. 8, 2012 (CN) .......................... 2012 1 0188994

(51) Int. Cl.
*G11B 5/48* (2006.01)
*H05K 1/02* (2006.01)

(52) U.S. Cl.
CPC .............. *H05K 1/0248* (2013.01); *G11B 5/486* (2013.01); *H05K 1/0245* (2013.01); *H05K 2201/09245* (2013.01); *H05K 2201/097* (2013.01)

(58) Field of Classification Search
USPC .............. 360/99.23–99.25, 244.1, 245.8–246
See application file for complete search history.

(56) References Cited

U.S. PATENT DOCUMENTS

| | | | |
|---|---|---|---|
| 5,737,152 A | 4/1998 | Balakrishnan | |
| 5,805,382 A * | 9/1998 | Lee et al. | 360/244.1 |
| 5,812,344 A | 9/1998 | Balakrishnan | |
| 7,271,985 B1 * | 9/2007 | Buhler et al. | 360/245.9 |
| 7,606,003 B2 * | 10/2009 | Amemiya et al. | 360/246 |
| 7,986,495 B2 | 7/2011 | Kamei et al. | |
| 8,017,874 B2 | 9/2011 | Honjo et al. | |
| 8,467,151 B1 * | 6/2013 | Huber | 360/246 |
| 8,553,364 B1 * | 10/2013 | Schreiber et al. | 360/245.9 |
| 8,759,690 B1 * | 6/2014 | DeBaets | 174/261 |
| 2005/0280944 A1 * | 12/2005 | Yang et al. | 360/245.9 |
| 2010/0226045 A1 | 9/2010 | Yamada et al. | |
| 2010/0307798 A1 * | 12/2010 | Izadian | 174/255 |

* cited by examiner

*Primary Examiner* — Nathan Danielsen
(74) *Attorney, Agent, or Firm* — Nixon & Vanderhye PC

(57) ABSTRACT

A suspension includes a positive write trace and a negative write trace. The positive write trace is separated into at least two positive write trace sections located at two different layers respectively, and the negative write trace is separated into at least two negative write trace sections located at two different layers respectively. Each positive write trace section and each negative write trace section are alternately arranged along a longitudinal direction on two different layers, and the positive write trace sections at different layers are connected together via conductive crossovers, and the negative write trace sections are connected together via conductive crossovers. The present invention can obtain balanced propagation time in the stacked trace structure to reduce signal distortion, and obtain widened frequency bandwidth.

19 Claims, 15 Drawing Sheets

SUSPENSION WITH DIVIDED POSITIVE AND NEGATIVE WRITE TRACE SECTIONS, AND HEAD GIMBAL ASSEMBLY AND DISK DRIVE UNIT WITH THE SAME

This application claims priority to Chinese Application No. 201210188994.5 filed 8, Jun. 2012, the entire contents of which is hereby incorporated by reference.

FIELD OF THE INVENTION

The present invention relates to information recording disk drive devices and, more particularly to a suspension with multiple-layer electrical traces design, a head gimbal assembly (HGA) and a disk drive unit with the same.

BACKGROUND OF THE INVENTION

Hard disk drives are common information storage devices. FIG. 1a provides an illustration of a typical disk drive unit 100 essentially consisting of a series of rotatable disks 101 mounted on a spindle motor 102, and a Head Stack Assembly (HSA) 130 which is rotatable about an actuator arm axis 105 for accessing data tracks on disks during seeking. The HSA 130 includes at least one drive arm 104 and HGA 150. Typically, a spindling voice-coil motor (VCM) (not shown) is provided for controlling the motion of the drive arm 104.

Referring to FIG. 1b, the HGA 150 includes a slider 103 having a reading/writing transducer (not shown) imbedded therein, a suspension 190 to load or suspend the slider 103 thereon. When the disk drive is on, a spindle motor 102 will rotate the disk 101 at a high speed, and the slider 103 will fly above the disk 101 due to the air pressure drawn by the rotated disk 101. The slider 103 moves across the surface of the disk 101 in the radius direction under the control of the VCM. With a different track, the slider 103 can read data from or write data to the disk 101.

FIG. 1c shows a conventional suspension, the suspension 190 includes a load beam 106, a base plate 108, a hinge 107 and a flexure 105, all of which are assembled together.

The load beam 106 is connected to the base plate 108 by the hinge 107. A locating hole 112 is formed on the load beam 106 for aligning the load beam 106 with the flexure 105. And the load beam 106 is welded with the flexure for increasing the strength of the entire structure.

The base plate 108 is used to enhance structure stiffness of the whole HGA 150. A mounting hole 113 is formed on one end of the base plate 108 for mounting the whole HGA 150 to the motor arm 104 (referring to FIG. 1a). Another hole 110 is formed on the other end of the base plate 108, which is aligned with a hole 110' formed on the hinge 107 and a hole 110" formed on the flexure 105. The hinge 107 has a mounting hole 131' formed on its one end corresponding to the mounting hole 113 of the base plate 108, and the hinge 107 is partially mounted to the base plate 108 with the mounting holes 131', 113 aligned with each other. The hinge 107 and the base plate 108 may be mounted together by laser welding at pinpoints 109 distributed on the hinge 107. Two hinge steps 115 are integrally formed at two sides of the hinge 107 at one end adjacent the mounting hole 131' for connecting with the flexure 105.

The flexure 105 runs from the hinge 107 to the load beam 106. The flexure 105 has a proximal end 119 adjacent the hinge 107 and a distal end 118 adjacent the load beam 106. A locating hole 112' is formed on the distal end 118 of the flexure 105 and aligned with the locating hole 112 of the load beam 106, thus obtaining a high assembly precision. A suspension tongue 116 is provided at the distal end of the flexure 105 to carry the slider 103 thereon.

As illustrated in FIG. 1d, the flexure 105 has a leading portion 121 adjacent the suspension tongue 116, and a tailing portion 122 opposite to the leading portion 121. A plurality of electrical traces 120 is formed on the flexure 105 along length direction thereof. More specifically, the electrical traces 120 begin with the leading portion 121 and terminate at the tailing portion 122. The suspension tongue 116 has a plurality of bonding pads 117 formed thereon for coupling the slider 103. One end of the electrical traces 120 connects to the bonding pads 117, and the other end thereof is electrically connected to a preamplifier (not shown). Generally, the electrical traces 120 extending from the bonding pads 117 includes three pairs (but not limited to three pairs of trace) which respectively are a couple of read traces 123, write traces 124 and heat traces 125 as shown in FIG. 1e. All of traces will be jointed to several terminal pads 126 at the tailing portion 122.

FIG. 1f shows a cross-section view of the detailed structure of the flexure 105 taken along the line A-A shown in FIG. 1d. The flexure 105 has a laminate structure 130 including a resilient stainless steel layer 131 and a polyimide layer 133 formed on the stainless steel layer 131. The read traces 123, write traces 124 and heat traces 125 are formed on the polyimide layer 133. Therein, the write traces 124 includes a positive write trace 1241 and a negative write trace 1242, which will operate as a differential pair. Accordingly, it is difficult to realize simultaneously the low impedance, high bandwidth in this microstrip type trace pair because the capacitive coupling is not strong enough. Ultimately, the impedance of the electrical traces is large, and finally affecting the writing operation of the slider 103.

In view of it, an improved suspension with stacked electrical traces had been developed. U.S. Pat. No. 7,986,495B2 discloses improved electrical trace pair with one write trace formed on an upper trace layer and another write trace formed on a lower trace layer. As shown in FIG. 2a, insulating layer 40 is composed of first, second and third insulting layers 41, 42, 43. The first insulating layer 41 is formed on the suspension body 10. And the write trace W1 (negative) for writing information in a magnetic disk (not shown) and the read trace R1 for reading information from the magnetic disk are formed on the first insulating layer 41. The write trace W2 (positive) and the read trace R2 are formed on the second insulating layer 42. With this design, the impedance of the write traces is lower. Especially, the impedances of the write traces on the upper trace layer and the lower trace layer can be adjusted to the same value by adjusting the width of the write traces. Thus the improved suspension with stacked electrical traces is advanced due to its lower impedance and reduced crosstalk.

However, as the distance between the write traces on the upper trace layer and the grounding layer (that is the suspension body 10) is different from that between the write trace on the lower trace layer and the grounding layer, thus the electrical performance of the write traces on the upper trace layer and the lower trace layer are different. For example, the signal propagation time of the upper trace layer and the signal propagation time of the lower trace layer are not balanced, which may cause signal distortion, especially in high data rate transmission condition. As shown in FIG. 2b, it can be seen that, the signal propagation times in the positive write trace and the negative write trace are different.

Thus, there is a need for an improved suspension with improve stacked electrical traces, an HGA and a disk drive unit that do not suffer from the above-mentioned drawbacks.

REFERENCES CITED

U.S. Pat. No. 7,986,495 B2, July 2011 Katsutoshi Kamei et al.;
U.S. Pat. No. 8,017,874B2, September 2011 Mitsuru Honjo et al.;
US PUB. 2010/0226045A1, September 2010 Yukie Yamada et al.;
U.S. Pat. No. 5,812,344, September 1998 Arun Balakrishnan;
U.S. Pat. No. 5,737,152, April 1998 Arun Balakrishnan.

SUMMARY OF THE INVENTION

One aspect of the present invention is to provide a suspension with improved electrical traces design, which can obtain improved electrical performance on the upper trace layer and the lower trace layer, specifically obtain balanced propagation time in the stacked trace structure to reduce signal distortion; and obtain widened frequency bandwidth thereby improving writing operation.

Another aspect of the present invention is to provide an HGA including a suspension with improved electrical traces design, which can obtain improved electrical performance on the upper trace layer and the lower trace layer, specifically obtain balanced propagation time in the stacked trace structure to reduce signal distortion; and obtain widened frequency bandwidth thereby improving writing operation.

Yet another aspect of the present invention is to provide a disk drive unit including a suspension with improved electrical traces design, which can obtain improved electrical performance on the upper trace layer and the lower trace layer, specifically obtain balanced propagation time in the stacked trace structure to reduce signal distortion; and obtain widened frequency bandwidth thereby improving writing operation.

To achieve above objectives, a suspension for an HGA of the present invention includes a flexure having a leading portion and a tailing portion opposite to the leading portion; and a plurality of electrical traces formed above the flexure and extending from the leading portion to the tailing portion, the electrical traces with a multiple-layer structure comprising a positive write trace and a negative write trace. The positive write trace is divided into at least two positive write trace sections located at an upper trace layer and a lower trace layer respectively, and the negative write trace is divided into at least two negative write trace sections located at the upper trace layer and the lower trace layer respectively. Each positive write trace section and each negative write trace section are alternately arranged along a longitudinal direction on both the upper trace layer and the lower trace layer. The positive write trace sections at different layers are connected together via conductive crossovers formed between the upper trace layer and the lower trace layer, and the negative write trace sections are connected together via conductive crossovers formed between the upper trace layer and the lower trace layer As an exemplary embodiment, the positive write trace is divided into two positive write trace sections, and the negative write trace is divided into two negative write trace sections.

Preferably, the positive write trace is separated into two positive write trace sections with the same length which include a first positive write trace section and a second positive write trace section; the negative write trace is separated into two negative write trace sections with the same length which include a first negative write trace section and a second negative write trace section.

More preferably, the first positive write trace section and the second negative write trace section are alternately arranged on the upper trace layer, and the first negative write trace section and the second positive write trace section are alternately arranged on the lower trace layer; the first positive write trace section is connected with the second positive write trace section via a first crossover, and the first negative write trace section is connected with the second negative write trace section via a second crossover.

As another exemplary embodiment, the positive write trace is separated into three positive write trace sections which include a first, second and third positive write trace section; the negative write trace is separated into three negative write trace sections which include a first, second and third negative write trace section.

Preferably, the first positive write trace section, the second negative write trace section and the third positive write trace section are alternately arranged on the upper trace layer, and the first negative write trace section, the second positive write trace section and the third negative write trace section are alternately arranged on the lower trace layer; the first, second and third positive write trace sections are connected in turn via two crossovers, and the first, second and third negative write trace sections are connected in turn via two crossovers.

More preferably, the total length of the first and third positive write trace sections and the total length of the first and third negative write trace sections are equal to that of the second positive write trace section and the second negative write trace section.

Preferably, for either positive or negative signal in the differential pair, the total distance of signal propagating in the upper trace layer is equal to the total distance of signal propagating in the lower trace layer. Thus the propagation times are balanced for both positive and negative signals.

Preferably, an insulating layer is formed between the upper trace layer and the lower trace layer.

Preferably, the flexure has a laminated structure comprising a substrate layer, and a conductive layer and a dielectric layer formed thereon in turn.

Preferably, the crossover is made of Au, Ag, Cu, Cr or Ni.

An HGA of the present invention includes a slider and a suspension for supporting the slider. The suspension includes a flexure having a leading portion and a tailing portion opposite to the leading portion; and a plurality of electrical traces formed above the flexure and extending from the leading portion to the tailing portion, the electrical traces with a multiple-layer structure comprising a positive write trace and a negative write trace. The positive write trace is divided into at least two positive write trace sections located at an upper trace layer and a lower trace layer respectively, and the negative write trace is divided into at least two negative write trace sections located at the upper trace layer and the lower trace layer respectively. Each positive write trace section and each negative write trace section are alternately arranged along a longitudinal direction on both the upper trace layer and the lower trace layer. The positive write trace sections at different layers are connected together via conductive crossovers formed between the upper trace layer and the lower trace layer, and the negative write trace sections are connected together via conductive crossovers formed between the upper trace layer and the lower trace layer.

As an exemplary embodiment, the positive write trace is divided into two positive write trace sections, and the negative write trace is divided into two negative write trace sections.

Preferably, the positive write trace is separated into two positive write trace sections with the same length which include a first positive write trace section and a second positive write trace section; the negative write trace is separated into two negative write trace sections with the same length which include a first negative write trace section and a second negative write trace section.

More preferably, the first positive write trace section and the second negative write trace section are alternately arranged on the upper trace layer, and the first negative write trace section and the second positive write trace section are alternately arranged on the lower trace layer; the first positive write trace section is connected with the second positive write trace section via a first crossover, and the first negative write trace section is connected with the second negative write trace section via a second crossover.

As another exemplary embodiment, the positive write trace is separated into three positive write trace sections which include a first, second and third positive write trace section; the negative write trace is separated into three negative write trace sections which include a first, second and third negative write trace section.

Preferably, the first positive write trace section, the second negative write trace section and the third positive write trace section are alternately arranged on the upper trace layer, and the first negative write trace section, the second positive write trace section and the third negative write trace section are alternately arranged on the lower trace layer; the first, second and third positive write trace sections are connected in turn via two crossovers, and the first, second and third negative write trace sections are connected in turn via two crossovers.

More preferably, the total length of the first and third positive write trace sections and the total length of the first and third negative write trace sections are equal to that of the second positive write trace section and the second negative write trace section.

Preferably, for either positive or negative signal in the differential pair, the total distance of signal propagating in the upper trace layer is equal to the total distance of signal propagating in the lower trace layer. Thus the propagation times are balanced for both positive and negative signals.

Preferably, an insulating layer is formed between the upper trace layer and the lower trace layer.

Preferably, the flexure has a laminated structure comprising a substrate layer, and a conductive layer and a dielectric layer formed thereon in turn.

Preferably, the crossover is made of Au, Ag, Cu, Cr or Ni.

A disk drive unit of the present invention includes an HGA including a slider and a suspension that supports the slider, a drive arm connected to the HGA; a series of disks, and a spindle motor operable to spin the disks. And the suspension includes a flexure having a leading portion and a tailing portion opposite to the leading portion; and a plurality of electrical traces formed above the flexure and extending from the leading portion to the tailing portion, the electrical traces with a multiple-layer structure comprising a positive write trace and a negative write trace. The positive write trace is divided into at least two positive write trace sections located at an upper trace layer and a lower trace layer respectively, and the negative write trace is divided into at least two negative write trace sections located at the upper trace layer and the lower trace layer respectively, And each positive write trace section and each negative write trace section are alternately arranged along a longitudinal direction on both the upper trace layer and the lower trace layer. The positive write trace sections at different layers are connected together via conductive crossovers formed between the upper trace layer and the lower trace layer, and the negative write trace sections are connected together via conductive crossovers formed between the upper trace layer and the lower trace layer.

Compared with the prior art, as the positive write trace is separated into at least two positive write trace sections, the negative write trace is separated into at least two negative write trace sections, and each positive write trace section and each negative write trace section are alternately arranged along a longitudinal direction on both the upper trace layer and the lower trace layer, and the positive write trace sections at different layers are connected together via conductive crossovers, and the negative write trace sections are connected together via conductive crossovers, thus, the propagation times for the positive signal and the negative signal are the same, thus the signal distortion is reduced and even eliminated, and in turn, the electrical performance in the stacked trace structure is balanced and improved. At the same time, the impedance of the write traces is lowered and the frequency bandwidth is widened ultimately.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings:

FIG. 4b is a cross-sectional view of the suspension taken along the line B-B of the FIG. 4a;

FIG. 4c a cross-sectional view of the suspension taken along the line C-C of the FIG. 4a;

DETAILED DESCRIPTION OF ILLUSTRATED EMBODIMENTS

Figure 1A:
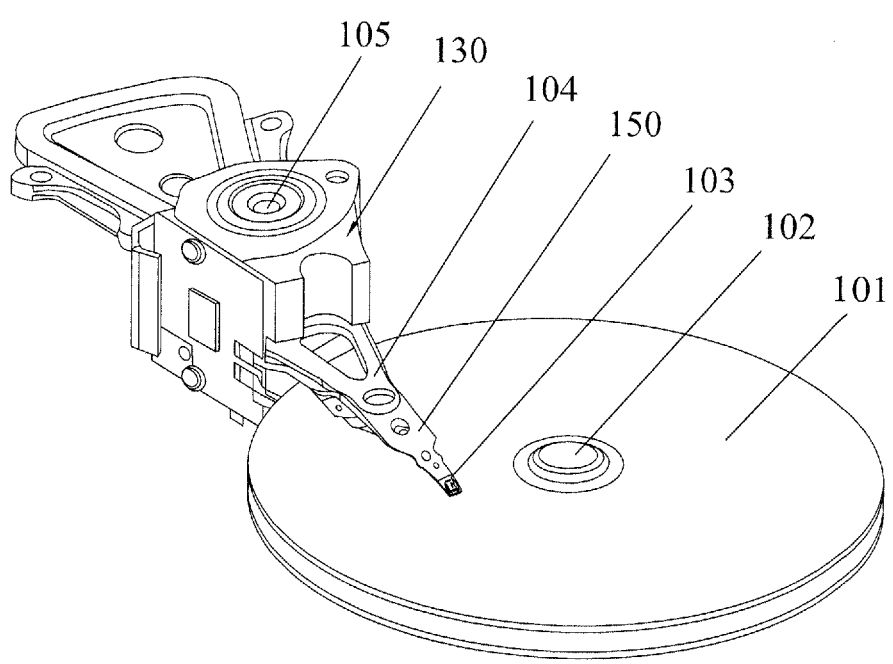
FIG. 1a is a perspective view of a conventional disk drive unit.
Figure 1B:
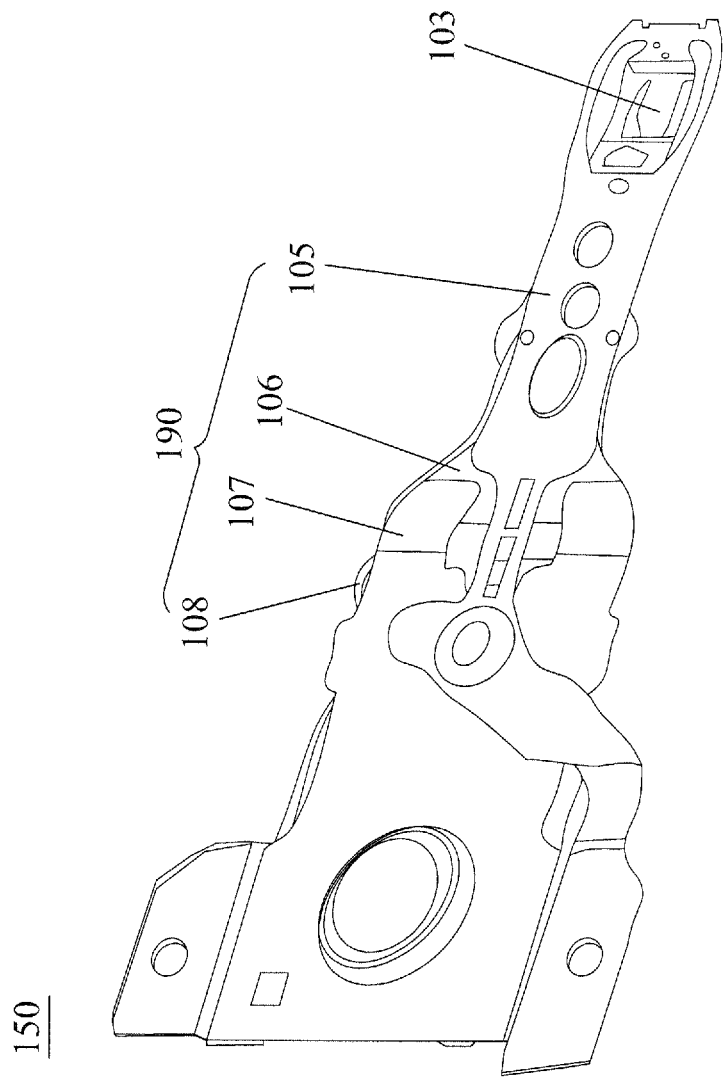
FIG. 1b is a perspective view of a conventional HGA.
Figure 1C:
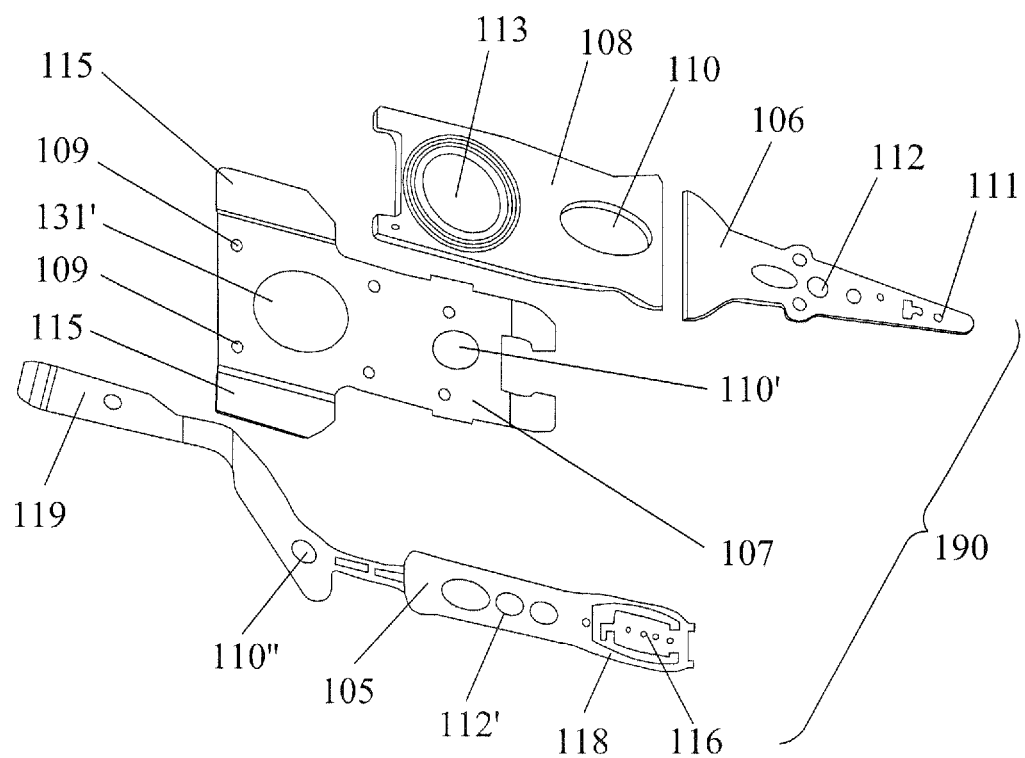
FIG. 1c is an exploded perspective view of the HGA shown in FIG. 1b.
Figure 1D:
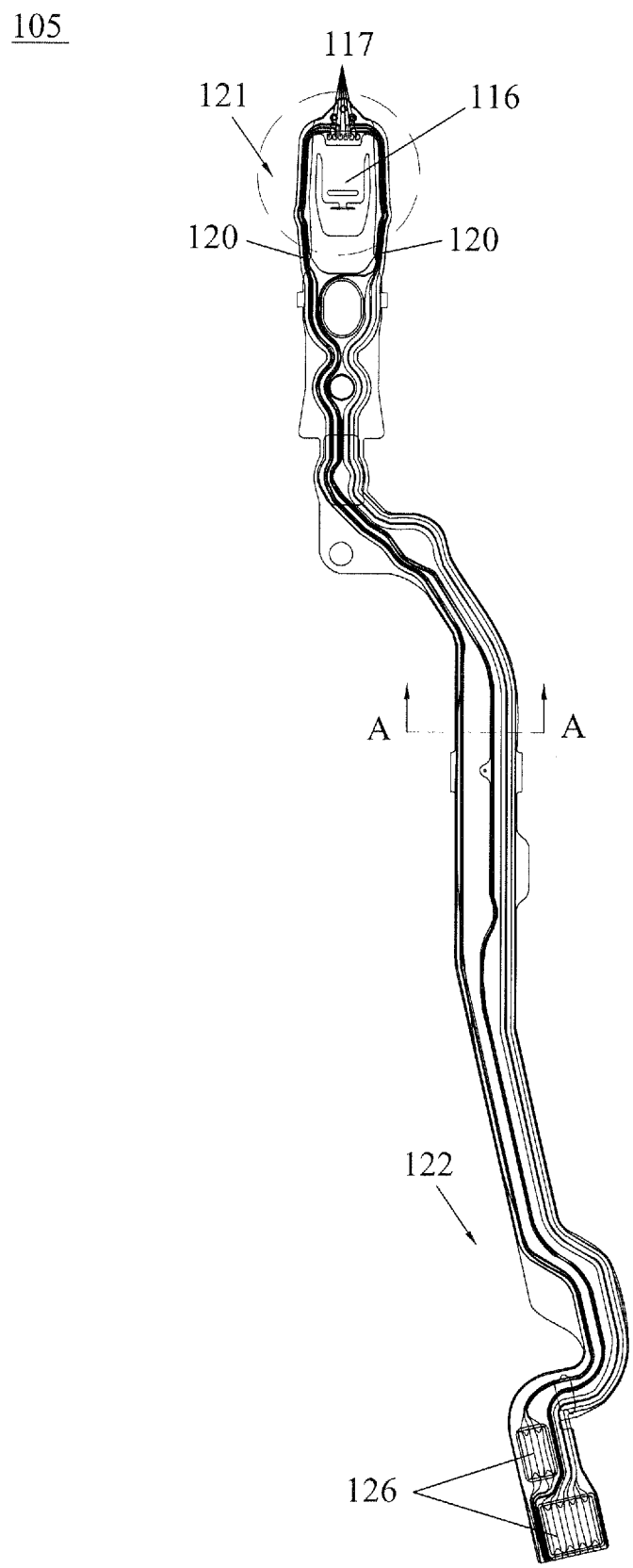
FIG. 1d is a top plan view of a flexure of the suspension shown in FIG. 1c.
Figure 1E:
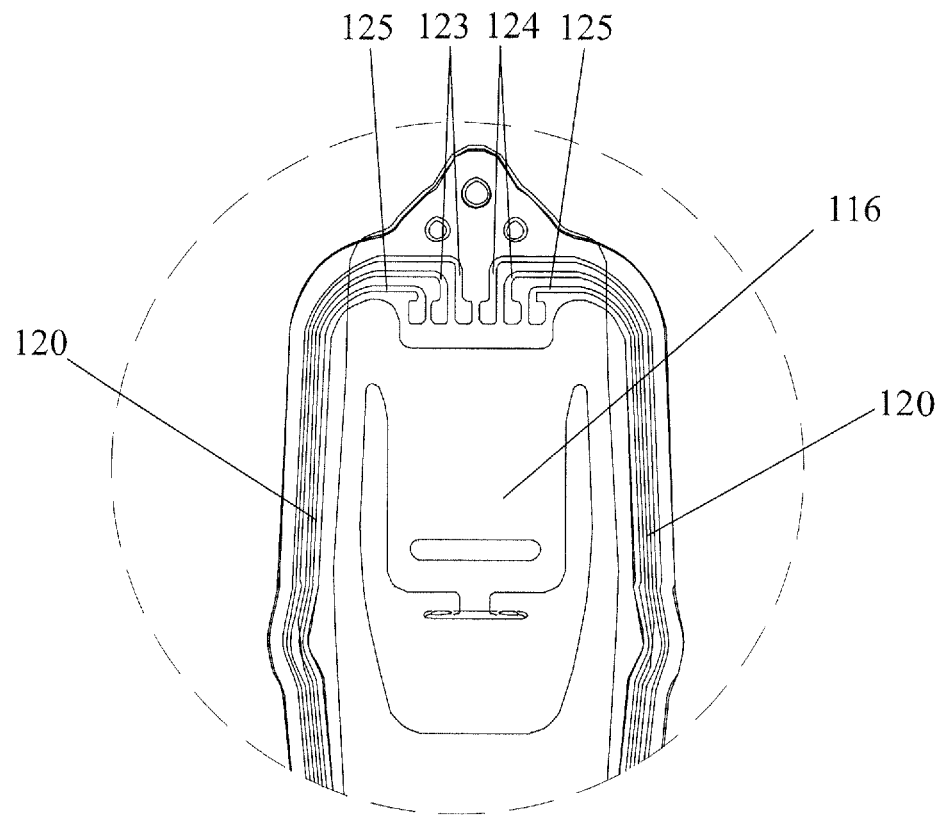
FIG. 1e is a enlarged view of the leading portion of the flexure with microstrip trace illustrated by the broken line shown in FIG. 1d.
Figure 1F:
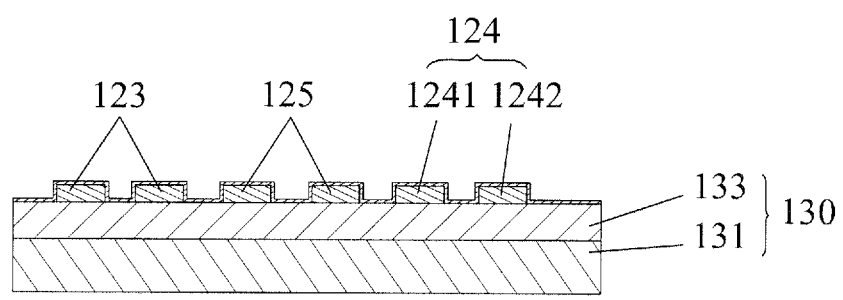
FIG. 1f is a cross-sectional view of the detailed structure of the flexure with stacked trace taken along the line A-A shown in FIG. 1d.
Figure 2A:
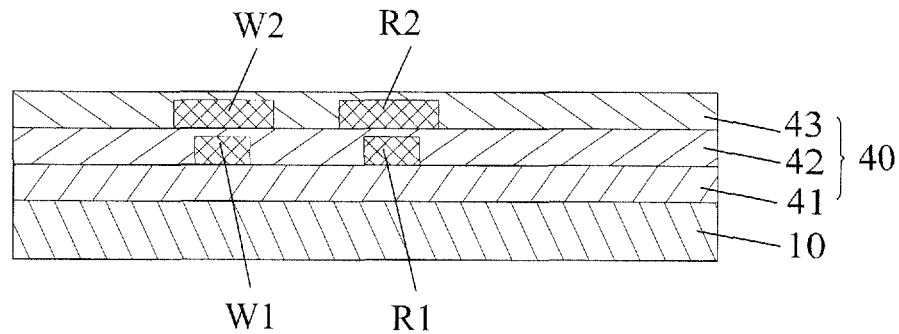
FIG. 2a is a cross-sectional view of another conventional suspension with stacked electrical traces.
Figure 2B:
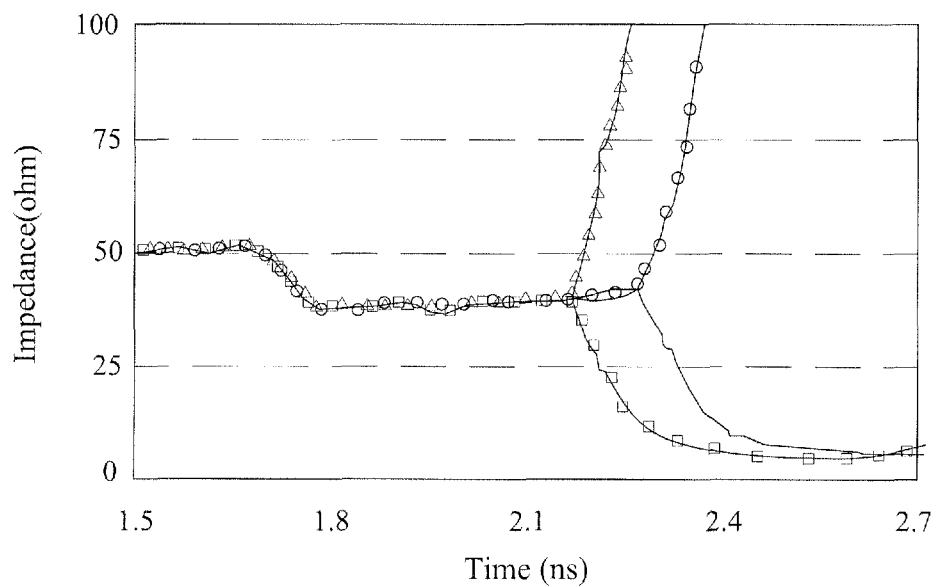
FIG. 2b is Time Domain Reflection (TDR) simulation result for stacked write traces of the prior art.

Various preferred embodiments of the invention will now be described with reference to the figures, wherein like reference numerals designate similar parts throughout the various views. As indicated above, the invention is directed to a suspension for an HGA of a disk drive unit, the suspension includes improved electrical traces design, thereby obtaining improved electrical performance on the upper trace layer and the lower trace layer, specifically obtain balanced propagation time in the stacked trace structure to reduce signal distortion; and obtaining widened frequency bandwidth to improve writing operation.

Figure 3A:
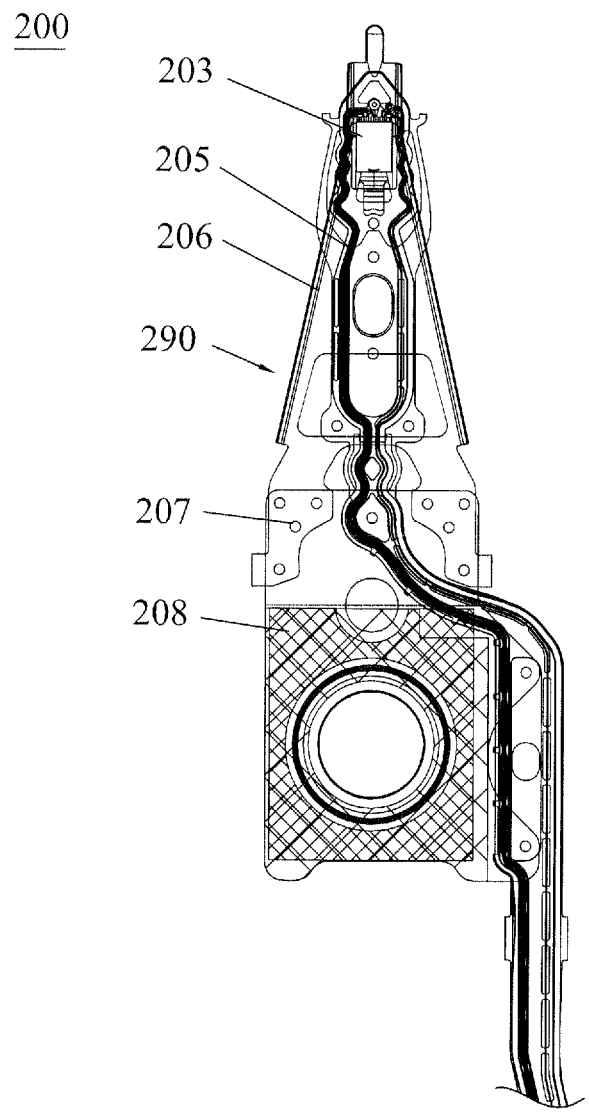
FIG. 3a is a perspective view of a HGA according to an embodiment of the present invention.

FIG. 3a shows a HGA 200 according to an embodiment of the invention including a suspension 290 and a slider 203 carried on the suspension 290. The suspension 290 includes a load beam 206, a base plate 208, a hinge 207 and the flexure 205, all of which are assembled with each other. And then the slider 203 is carried on the flexure 205. It is known that the slider 203 has terminals that are connected to a write element and a read element (sensor), which are connected to the write and read terminals. The write element is, for example, a standard induction type magnetic transducer. The read element is a MR element, a GMR element, or a TMR element having a high read sensitivity.

The load beam 206 is used to transfer load forces to the flexure 205 and a slider mounted on the flexure 205. Any suitable rigid material such as stainless steel may be used to form the load beam 206 such that the load beam 206 has sufficient stiffness to transfer the load forces to the flexure 205. The load beam 206 is connected to the base plate 208 by the hinge 207. A locating hole (not labeled) is formed on the load beam 206 for aligning itself with the flexure 205. A dimple (not labeled) is formed on the load beam 206 to support the flexure 205 at a position corresponding to a center of the slider 203. By this engagement of the dimple with the flexure 205, the load forces can be transferred to the slider uniformly.

The base plate 208 is used to enhance structure stiffness of the whole suspension 290 and may be made of rigid material such as stainless steel. A mounting hole (not labeled) is formed on one end of the base plate 208 for mounting the whole suspension 290 to a motor arm of a disk drive unit.

Figure 3B:
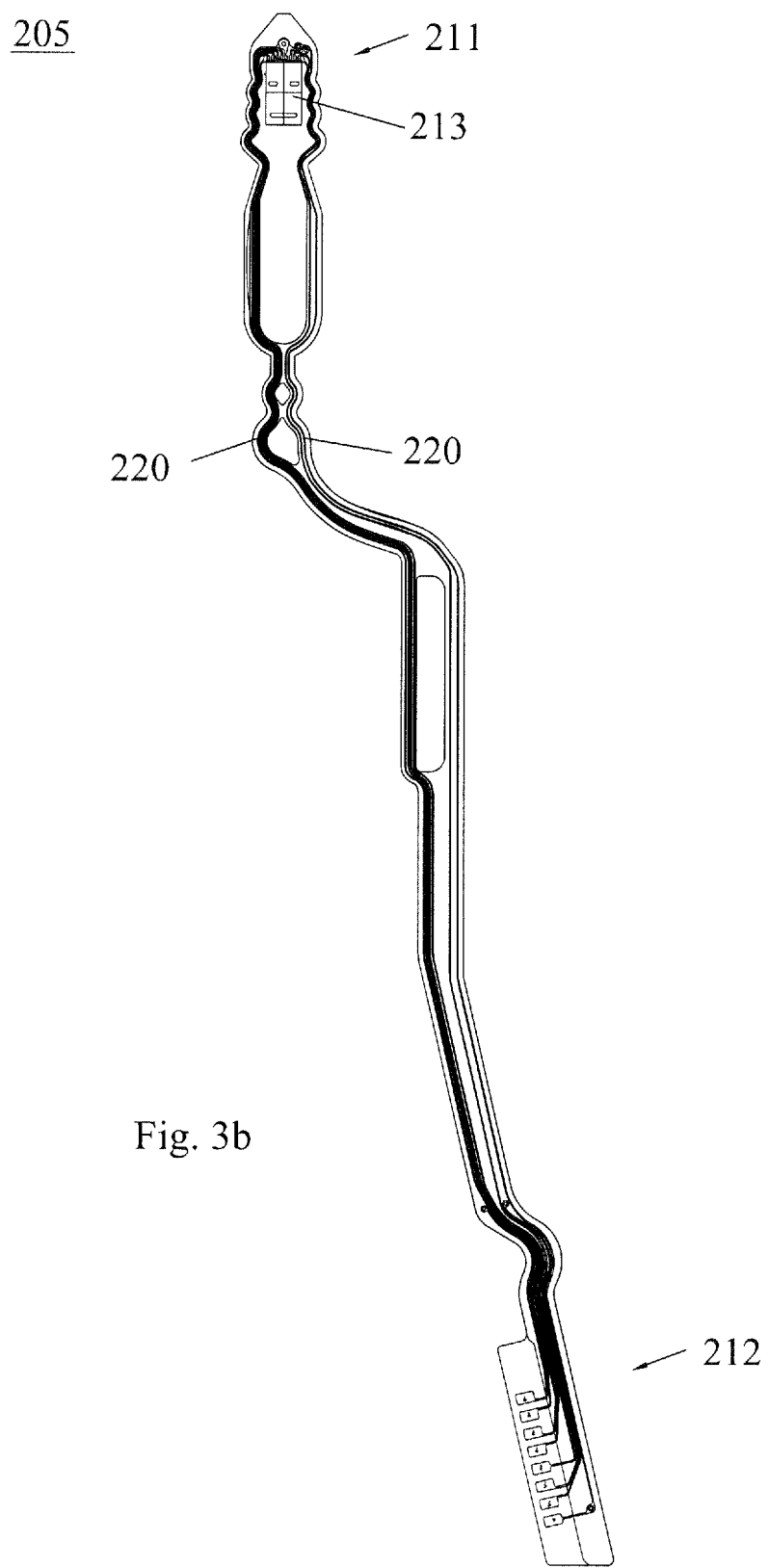
FIG. 3b is a suspension according to an embodiment of the present invention.

As shown in FIG. 3b, the flexure 205 runs from the hinge 207 to the load beam 206. The flexure 205 has a leading portion 211 and a tailing portion 212 opposite to the leading portion 211. A suspension tongue 213 is provided at the leading portion 211 of the flexure 205 to support a slider 203 thereon. A plurality of electrical traces 220 is formed on the flexure 205 along longitudinal direction thereof. More specifically, the electrical traces 220 extend from the leading portion 211 to the tailing portion 212, and the leading portion 211 and the trailing portion 212 can be considered as the start and terminal ends of the electrical traces 220. In particular, the electrical traces 220 have several pads 2111 (referring to FIG. 4a) positioned at the leading portion 211 of the flexure 205, so as to couple the slider 203 at the suspension tongue 213. Similarly, the electrical traces 220 also have several pads 2121 (referring to FIG. 4d) positioned at the tailing portion 212 of the flexure 205, so as to connect with a flexure printed cable and preamplifier (not shown).

Figure 4A:
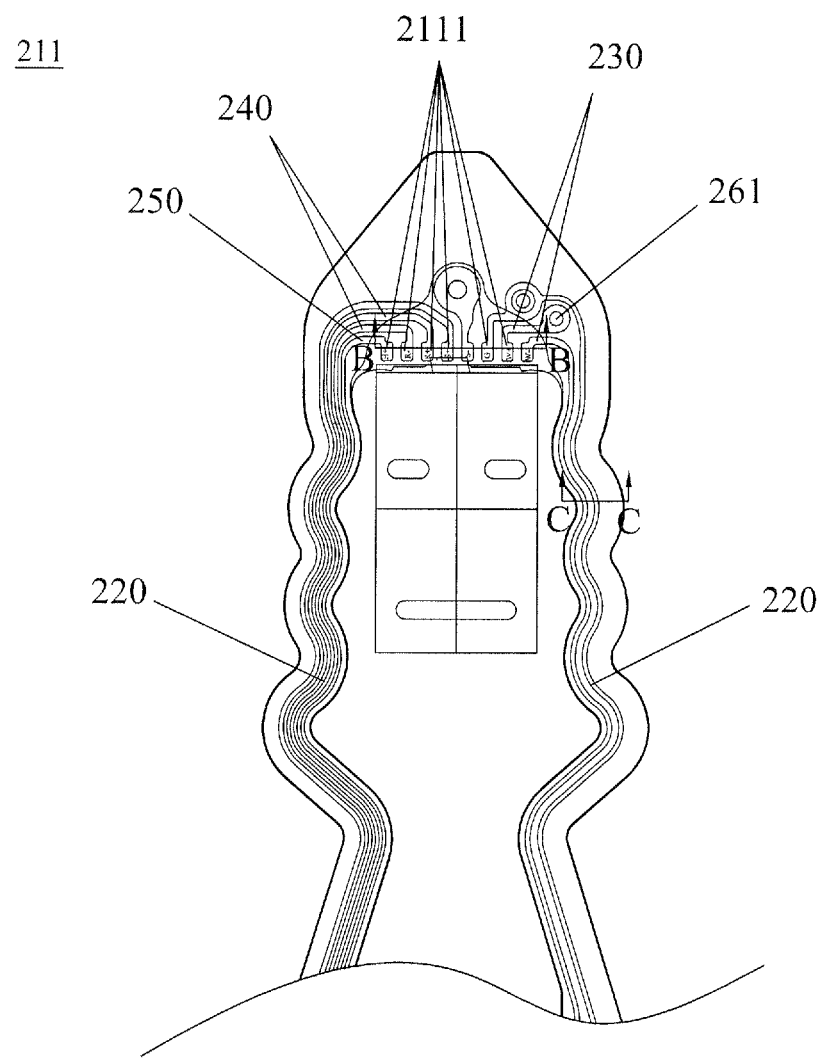
FIG. 4a is an enlarged partial view of the suspension at the leading portion shown in FIG. 3b.
Figure 4B:
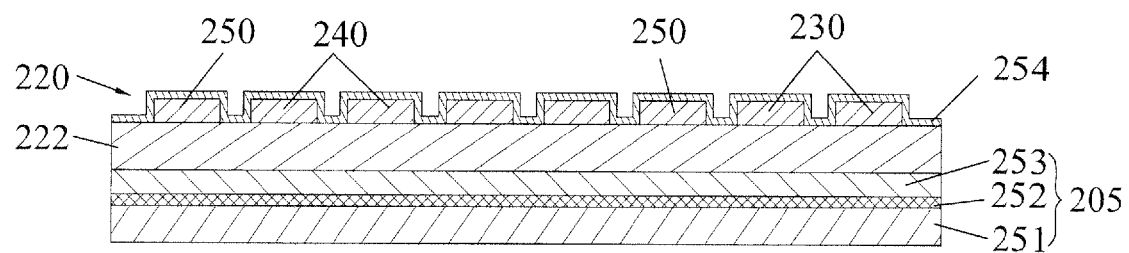

FIG. 4a is an enlarged partial view of the suspension 290 at the leading portion 211 shown in FIG. 3b, and FIG. 4b is a cross-sectional view of the suspension 290 taken along the line B-B of the FIG. 3b.

As illustrated in FIG. 4a, the electrical traces 220 includes a pair of write traces 230, a pair of read traces 240 and a pair of heat traces 250, and other functional traces (not labeled) for example, a pair of fly height detection traces for detecting distance between the slider 203 and the disk, each pair of which includes a positive signal path and a negative signal path. That is, the write traces 230 include a positive write trace (not labeled) and a negative write trace (not labeled) at the leading portion 211. Accordingly, eight pads 2111 are connected with the four pairs of traces mentioned above. As another embodiment, the electrical traces 220 can includes more than four pairs of traces, and further includes other functional traces such as additional pair of fly height adjustment traces (not shown) for adjusting distance between the slider 203 and the disk. In that case, the pads are increased accordingly.

As shown in FIG. 4b, the flexure 205 has a laminate structure that includes a substrate layer 251 that is made of a low conductivity thin plate, an optional conductive layer 252 made of Cu for example formed on the substrate layer 251, and dielectric layers 253 and 222 formed on the conductive layer 252. The low conductivity thin plate is, for example, a resilient thin stainless steel (SST) plate, which is used for a support and meanwhile a grounding plate for the electrical traces 220. In the present invention, the dielectric layers 253 and 222 are made of flexible dielectric resin such as polyimide. On the dielectric layers 253 and 222, the electrical traces 220 are formed. Preferably, a cover layer 254 with a thickness of about 5 µm is formed above the electrical traces 220 to protect them from external force and the like.

Figure 4C:
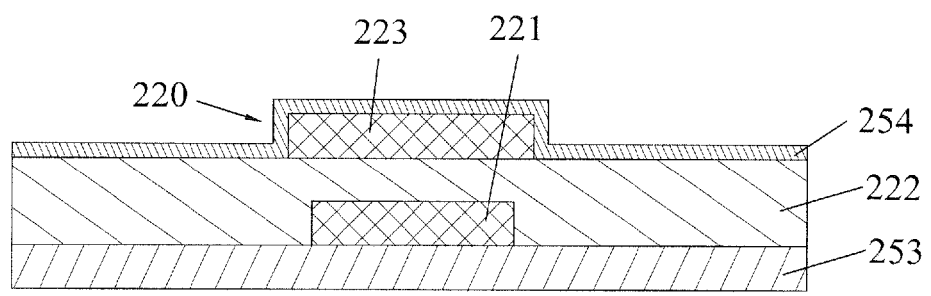

Specifically, the electrical traces 220 has a multiple-layer structure in other positions along longitudinal direction that includes a lower trace layer 221 and an upper trace layer 223 formed above the lower trace layer 221 as showed in FIG. 4c. Preferably, the multiple-layer structure further includes an insulating layer 222 sandwiched between the lower trace layer 221 and the upper trace layer 223. At the initial position of the electrical traces 220, the pair of write traces 230, the pair of read traces 240 and the pair of heat traces 250 are arranged at the upper trace layer 223.

Subsequently, as shown in FIG. 4a, a via portion 261 is connected with one of the two write traces 230 which are in the upper trace layer 223, and the via portion 261 is served as changing one of the two write traces 230 at the upper trace layer 223 to lower trace layer 221 as shown in FIG. 4c (other traces are omitted here for better showing the write traces 230), so as to include the stacked trace structure of write trace pair. Within the contemplation of the present invention, the electrical traces 220 are divided into a multiple-layer structure. As an embodiment, the positive write trace is separated into at least two positive write trace sections which are located at two different layers, and the negative write trace is separated into at least two negative write trace sections which are located at two different layers. Concretely, each positive write trace section and each negative write trace section are alternately arranged along a longitudinal direction on both the upper trace layer 223 and the lower trace layer 221, and the positive write trace sections at different layers are connected together via conductive crossovers formed between the upper trace layer 223 and the lower trace layer 221, and the negative write trace sections are connected together via conductive crossovers formed between the upper trace layer 223 and the lower trace layer 221.

Figure 4D:
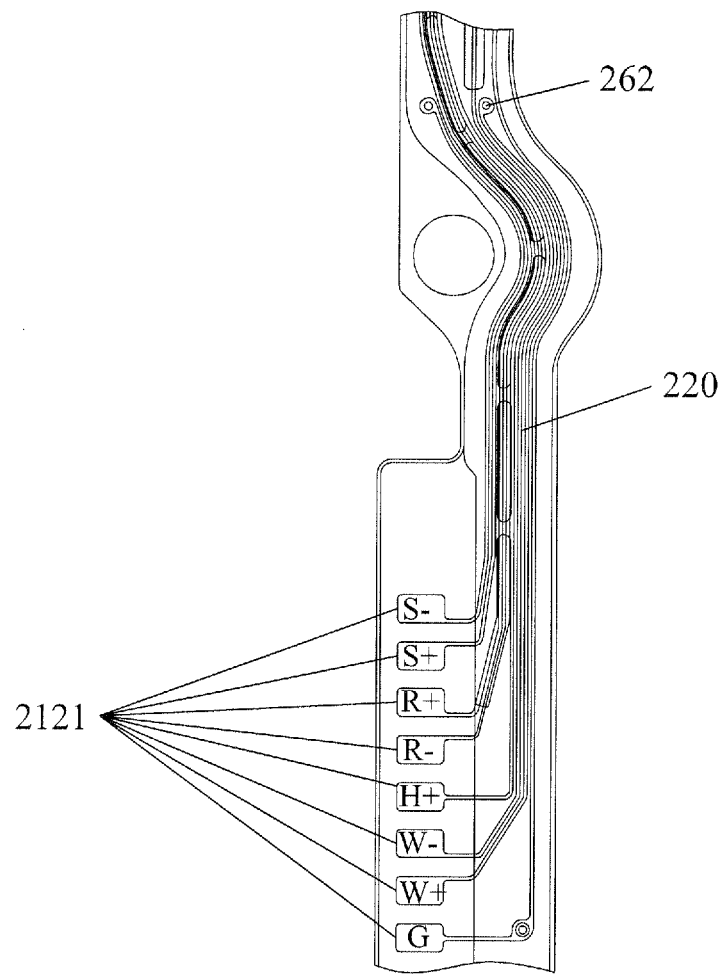
FIG. 4d is an enlarged partial view of the suspension at the tailing portion shown in FIG. 3b.

It should be noticed that, the electrical traces 220 have no multiple-layer structure mentioned above at the leading portion 211 and the tailing portion 212 of the flexure 205(namely the ends of the flexure 205). Please turn to FIG. 4d, which shows the structure of the electrical traces 220 at the tailing portion 212. As illustrated in FIG. 4d, the electrical traces 220 have a via portion 262 at the tailing portion 212 of the flexure 205, and the via portion 262 is served as changing one of the write traces 230 at the lower trace layer 221 to the upper trace layer 223, so as to connect the two write traces 230 to writer tail pads which are located at the upper trace layer 223. And several pads 2121 are connected with the electrical traces 220 at the terminal end of the flexure 205, and its detailed description is omitted here.

Figure 5:
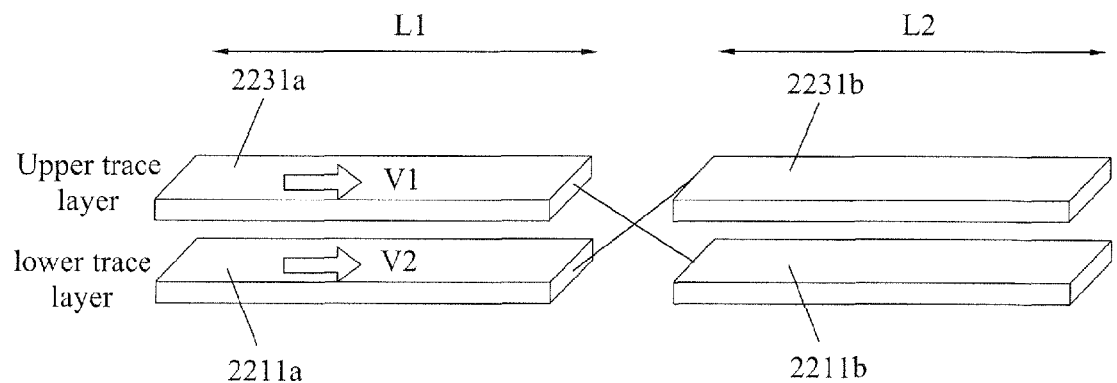
FIG. 5 is a schematic view of the positive write trace and the negative write trace at the upper trace layer and the lower trace layer according to a first embodiment of the present invention.
Figure 6:
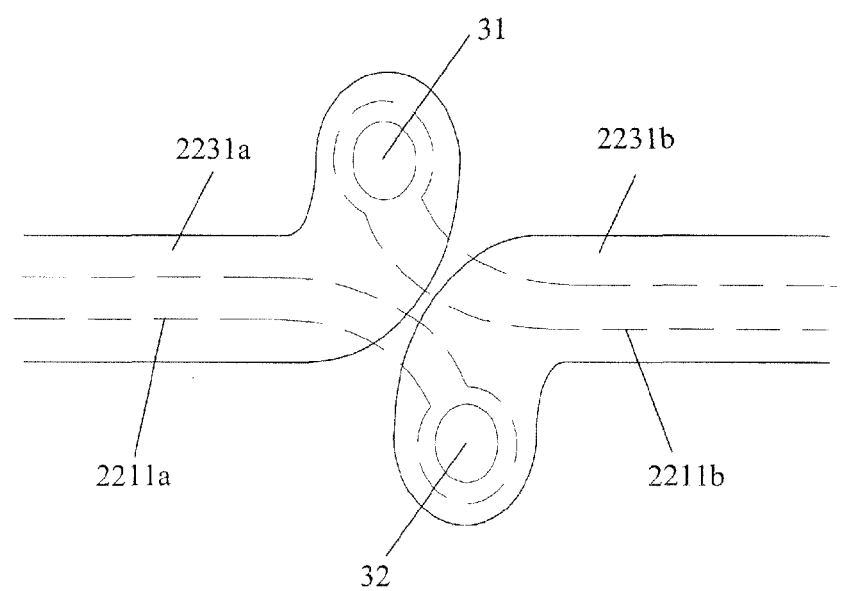
FIG. 6 is a top view of the positive write trace and the negative write trace at the upper trace layer and the lower trace layer.

As a first embodiment, as shown in FIG. 5, the positive write trace is separated into a first positive write trace section 2231a and a second positive write trace section 2211b with the same length, and the negative write trace is separated into a first negative write trace section 2211a and a second negative write trace section 2231b with the same length. Concretely, the first positive write trace section 2231a and the second negative write trace section 2231b are arranged on the upper trace layer 223, and the first negative write trace section 2211a and the second positive write trace section 2211b are arranged on the lower trace layer 221. As shown in FIG. 6, the first positive write trace section 2231a is connected with the second positive write trace section 2211b via a first crossover 31 configured between the upper trace layer 223 and the lower trace layer 221, and the first negative write trace section 2211a is connected with the second negative write trace section 2231b via a second crossover 32 configured between the upper trace layer 223 and the lower trace layer 221.

Concretely, the first crossover 31 and the second crossover 32 are made of conductive material, such as Au, Ag, Cu, Cr or Ni, etc.

Basing on the above design, as shown in FIG. 5, voltages are inputted to the write traces. Concretely, V1 is the velocity of signal propagation in the upper trace layer 223, and V2 is the velocity of signal propagation in the lower trace layer 221. As described above, the length of the first positive write trace section 2231a is equal to that of the second positive write trace section 2211b, and the length of the first negative write trace section 2211a is equal to that of the second negative write trace section 2231b, and L1=L2=L. Thus, signal propagation time T01 for the positive write trace is:

$$T01 = \frac{L1}{V1} + \frac{L2}{V2}$$
$$= L\left(\frac{1}{V1} + \frac{1}{V2}\right);$$

signal propagation time T02 for the negative write trace is:

$$T02 = \frac{L1}{V2} + \frac{L2}{V1}$$
$$= L\left(\frac{1}{V1} + \frac{1}{V2}\right),$$

namely T01=T02.

Figure 7:
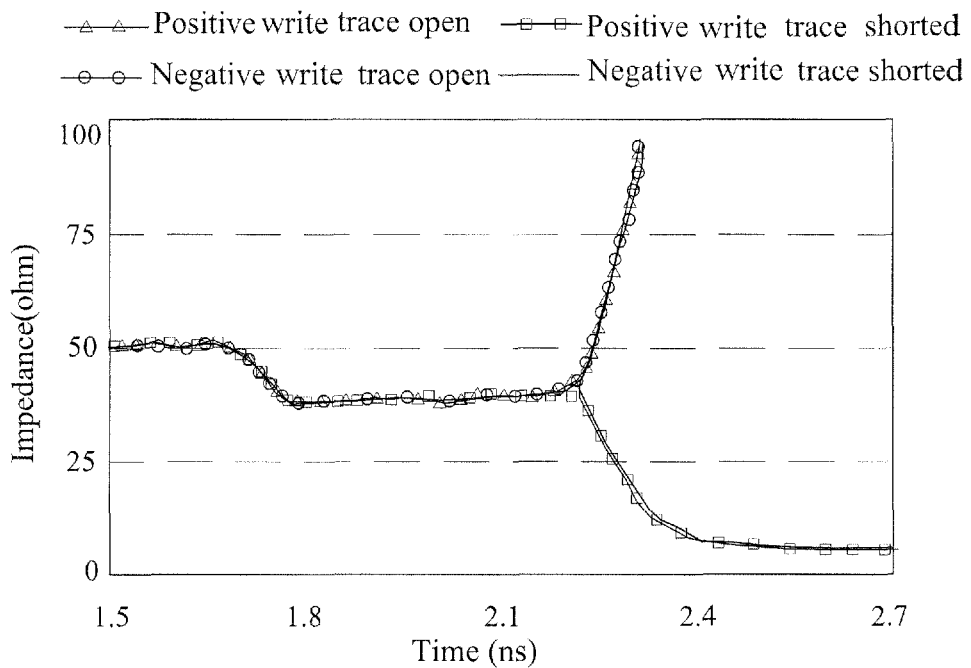
FIG. 7 is a TDR simulation result for the stacked write traces of the present invention (with crossovers)

FIG. 7 shows a TDR simulation result for the stacked write traces 230 of the present invention with crossovers. It can be seen that, in time domain, the impedance curves of positive write trace are overlapped with the impedance curves of negative write trace, which illustrates that the signal propagation times for the positive write trace and the negative write trace are the same. Thus the signal distortion is reduced and even eliminated, and in turn, the electrical performance on the upper trace layer 223 and the lower trace layer 221 is balanced and improved.

Figure 8:
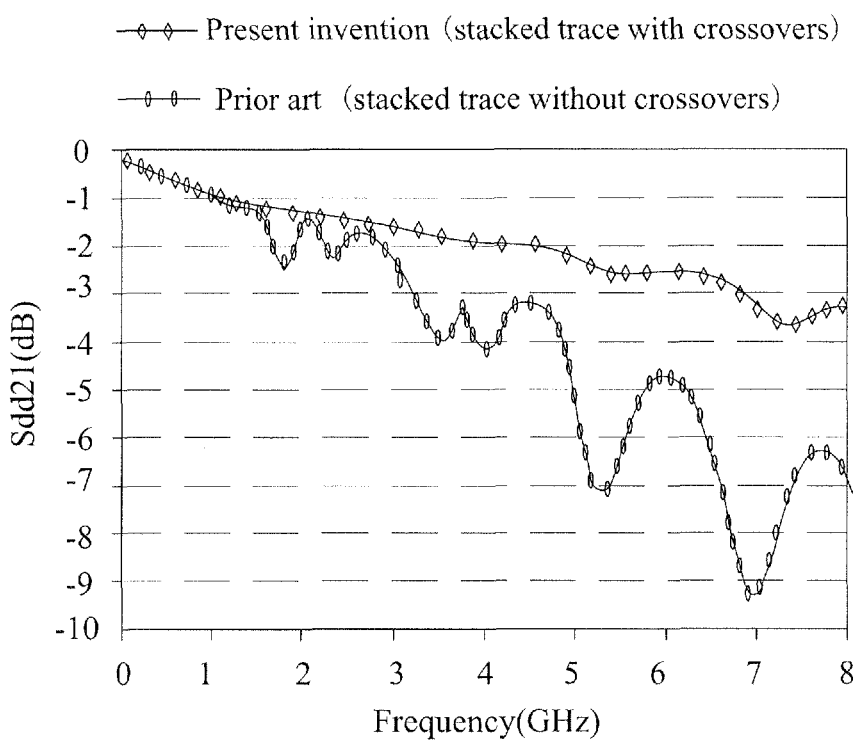
FIG. 8 is a bandwidth comparison simulated for the stacked write traces of the present invention (with crossovers) and the prior art (without crossover)

In addition, the bandwidth of the present invention is improved to about 6.95 GHz, which is much wider than that of the prior art (3.20 GHz), as illustrated in FIG. 8.

Figure 9:
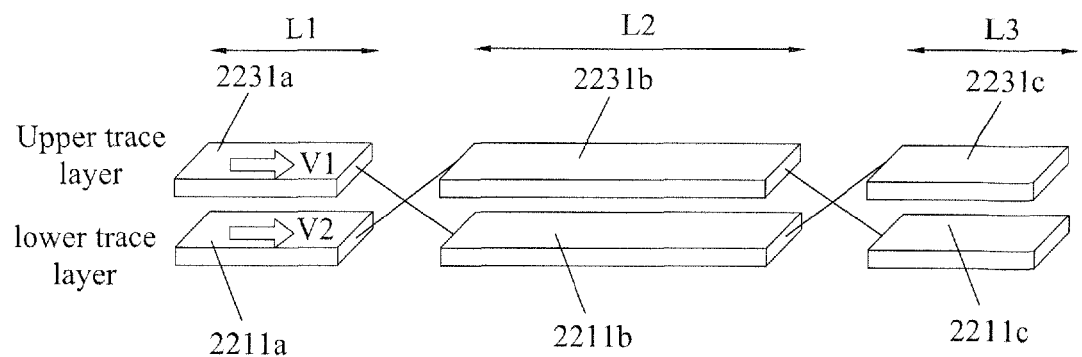
FIG. 9 is a schematic view of the positive write trace and the negative write trace according to a second embodiment of the present invention.

FIG. 9 shows the positive write trace and the negative write trace according to a second embodiment of the present invention. The positive write trace is separated into a first positive write trace section 2231a, a second positive write trace section 2211b and a third positive write trace section 2231c, and the negative write trace is separated into a first negative write trace section 2211a, a second negative write trace section 2231b and a third negative write trace section 2211c. Concretely, the total length of the first and third positive write trace sections 2231a (L1), 2231c (L3) and the total length of the first and third negative write trace sections 2211a (L1), 2211c (L3) are equal to that of the second positive write trace section 2211b (L2) and the second negative write trace section 2231b (L2). That is, L1+L3=L2=L.

Concretely, the first positive write trace section 2231a, the second negative write trace section 2231b and the third positive write trace section 2231c are alternately arranged on the upper trace layer 223, and the first negative write trace section 2211a, the second positive write trace section 2211b and the third negative write trace section 2211c are alternately arranged on the lower trace layer 221. And the first positive write trace section 2231a is connected with the second positive write trace section 2211b via a crossover (not shown), and the second positive write trace section 2211b is connected with the third positive write trace section 2231c via a crossover (not shown); the first negative write trace section 2211a is connected with the second negative write trace section 2231b via a crossover (not shown), and the second negative write trace section 2231b is connected with the third negative write trace section 2211c via a crossover (not shown).

When voltages are inputted to the write traces 230, concretely, V1 is the velocity of signal propagation in the upper trace layer 223, and V2 is the velocity of signal propagation in the lower trace layer 221 as shown in FIG. 9. Thus, signal propagation time T01 for the positive write trace is:

$$T01 = \frac{L1}{V1} + \frac{L2}{V2} + \frac{L3}{V1}$$
$$= L\left(\frac{1}{V1} + \frac{1}{V2}\right);$$

signal propagation time T02 for the negative write trace is:

$$T02 = \frac{L1}{V2} + \frac{L2}{V1} + \frac{L3}{V2}$$
$$= L\left(\frac{1}{V1} + \frac{1}{V2}\right),$$

namely T01=T02.

Figure 10:
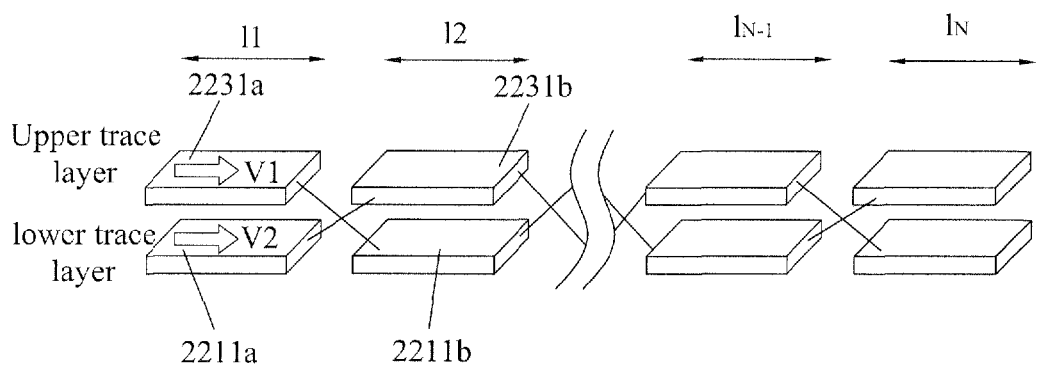
FIG. 10 is a schematic view of the positive write trace and the negative write trace with N sections at the upper trace layer and the lower trace layer according to a third embodiment of the present invention.

In general, the stacked write trace pair (including upper and lower trace layer) can be separated into N (N>=2) sections along its longitudinal direction, and crossovers (vias) are positioned in the junction points between every two sections, the signal path is exchanged between the upper and lower trace by those crossovers, the write trace sections and crossovers are arranged in a pattern along longitudinal direction. For example, as showed in FIG. 10, if the total sections N is even number, supposing the positive polarity of voltage is applied to the upper trace layer at the starting point (the left), the total length L01 of positive (negative) write trace sections in the upper (lower) trace layer can be expressed as:

$$L01 = \sum_{n=1}^{N-1} l_{2n-1}$$

the total length L02 of positive(negative) write trace sections in the lower(upper) trace layer can be expressed as:

$$L02 = \sum_{n=1}^{N} l_{2n},$$

and L01 is equal to L02.

That is, for either positive or negative signal in the differential pair, the total distance of signal propagating in the upper trace layer is equal to the total distance of signal propagating in the lower trace layer. Thus the propagation times are balanced for both positive and negative signals.

if the total sections N is odd number, supposing the positive polarity of voltage is also applied to the upper trace layer at the starting point (the left), the total length L01 of positive (negative) write trace sections in the upper(lower) trace layer can be expressed as:

$$L01 = \sum_{n=1}^{N} l_{2n-1},$$

the total length L02 of positive(negative) write trace sections in the lower (upper) trace layer can be expressed as:

$$L02 = \sum_{n=1}^{N-1} l_{2n},$$

and L01 is equal to L02.

That is, for either positive or negative signal in the differential pair, the total distance of signal propagating in the upper trace layer is equal to the total distance of signal propagating in lower trace layer. Thus the propagation times are balanced for both positive and negative signals.

By this token, the signal propagation times for the positive write trace and the negative write trace are the same, thus the signal distortion is reduced and even eliminated, concretely the jitter of the signal is reduced, and in turn, the electrical performance of the differential pair on the upper trace layer 223 and the lower trace layer 221 is balanced and improved. At the same time, the impedance of the write traces 230 is lowered and the frequency bandwidth is widened ultimately.

Figure 11:
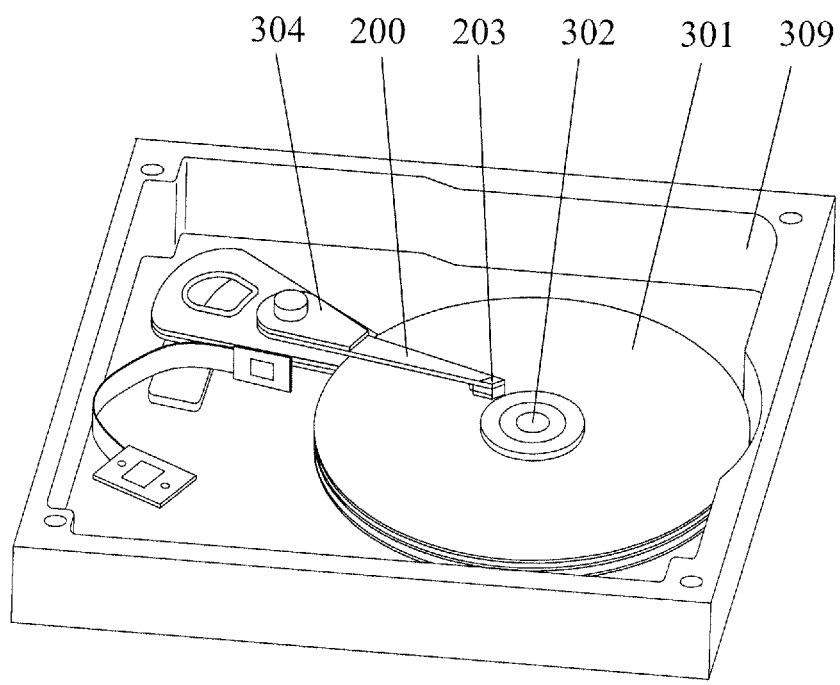
FIG. 11 is a perspective view of a disk drive unit according to an embodiment of the invention.

FIG. 11 is a disk drive unit according to an embodiment of the invention. The disk drive unit 300 includes an HGA 200, a drive arm 304 connected to the HGA 200, a series of rotatable disks 301, and a spindle motor 302 to spin the disk 301, all of which are mounted in a housing 309. The HGA 200 includes a suspension 290 having a flexure 205 and a slider 203 as mentioned above. And the suspension 290 has the same features mentioned above and can obtain the same advantages mentioned-above. Because the structure and/or assembly process of disk drive unit of the present invention are well known to persons ordinarily skilled in the art, a detailed description of such structure and assembly is omitted herefrom.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A suspension for a head gimbal assembly, comprising:
   a flexure having a leading portion and a tailing portion opposite to the leading portion; and
   a plurality of electrical traces formed above the flexure and extending from the leading portion to the tailing portion, the electrical traces with a multiple-layer structure comprising a positive write trace and a negative write trace;
   wherein the positive write trace is divided into at least two positive write trace sections located at an upper trace layer and a lower trace layer respectively, and the negative write trace is divided into at least two negative write trace sections located at the upper trace layer and the lower trace layer respectively, each positive write trace section and each negative write trace section are alternately arranged along a longitudinal direction on both the upper trace layer and the lower trace layer, and the positive write trace sections at different layers are connected together via conductive crossovers formed between the upper trace layer and the lower trace layer, and the negative write trace sections are connected together via conductive crossovers formed between the upper trace layer and the lower trace layer;
   wherein the total lengths of all positive write trace sections on the upper trace layer or on the lower trace layer are the same, and the total lengths of all negative write trace sections on the upper trace layer or on the lower trace layer are the same, such that the total distance for either positive signal propagating or negative positive signal propagating in the upper trace layer is equal to that in the lower trace layer.

2. The suspension according to claim 1, wherein the positive write trace is divided into two positive write trace sections, and the negative write trace is divided into two negative write trace sections.

3. The suspension according to claim 1, wherein the positive write trace is separated into two positive write trace sections with the same length which comprise a first positive write trace section and a second positive write trace section; the negative write trace is separated into two negative write trace sections with the same length which comprise a first negative write trace section and a second negative write trace section.

4. The suspension according to claim 3, wherein the first positive write trace section and the second negative write trace section are alternately arranged on the upper trace layer, and the first negative write trace section and the second positive write trace section are alternately arranged on the lower trace layer; the first positive write trace section is connected with the second positive write trace section via a first crossover, and the first negative write trace section is connected with the second negative write trace section via a second crossover.

5. The suspension according to claim 1, wherein the positive write trace is separated into three positive write trace sections which comprise a first, second and third positive write trace section; the negative write trace is separated into three negative write trace sections which comprise a first, second and third negative write trace section.

6. The suspension according to claim 5, wherein the first positive write trace section, the second negative write trace section and the third positive write trace section are alternately arranged on the upper trace layer, and the first negative write trace section, the second positive write trace section and the third negative write trace section are alternately arranged on the lower trace layer; the first, second and third positive write trace sections are connected in turn via two crossovers, and the first, second and third negative write trace sections are connected in turn via two crossovers.

7. The suspension according to claim 6, wherein the total length of the first and third positive write trace sections and the total length of the first and third negative write trace sections are equal to that of the second positive write trace section and the second negative write trace section.

8. The suspension according to claim 1, wherein an insulating layer is formed between the upper trace layer and the lower trace layer.

9. The suspension according to claim 1, wherein the flexure has a laminated structure comprising a substrate layer, and a conductive layer and a dielectric layer formed thereon in turn.

10. The suspension according to claim 1, wherein the crossover is made of Au, Ag, Cu, Cr or Ni.

11. The suspension according to claim 1, wherein the electrical traces further comprises a positive read trace and a negative read trace.

12. A head gimbal assembly, comprising:
a slider; and
a suspension for supporting the slider;
and the suspension comprises:
a flexure having a leading portion and a tailing portion opposite to the leading portion; and
a plurality of electrical traces formed above the flexure and extending from the leading portion to the tailing portion, the electrical traces with a multiple-layer structure comprising a positive write trace and a negative write trace;
wherein the positive write trace is divided into at least two positive write trace sections located at an upper trace layer and a lower trace layer respectively, and the negative write trace is divided into at least two negative write trace sections located at the upper trace layer and the lower trace layer respectively, each positive write trace section and each negative write trace section are alternately arranged along a longitudinal direction in both the upper trace layer and the lower trace layer, and the positive write trace sections at different layers are connected together via conductive crossovers formed between the upper trace layer and the lower trace layer, and the negative write trace sections are connected together via conductive crossovers formed between the upper trace and the lower trace layer;
wherein the total lengths of all positive write trace sections on the upper trace layer or on the lower trace layer are the same, and the total lengths of all negative write trace sections on the upper trace layer or on the lower trace layer are the same, such that the total distance for either positive signal propagating or negative positive signal propagating in the upper trace layer is equal to that in the lower trace layer.

13. The head gimbal assembly according to claim 12, wherein the positive write trace is divided into two positive write trace sections, and the negative write trace is divided into two negative write trace sections.

14. The head gimbal assembly to claim 12, wherein the positive write trace is separated into two positive write trace sections with the same length which comprises a first positive write trace section and a second positive write trace section; the negative write trace is separated into two negative write trace sections with the same length which comprises a first negative write trace section and a second negative write trace section.

15. The head gimbal assembly according to claim 14, wherein the first positive write trace section and the second negative write trace section are alternately arranged on the upper trace layer, and the first negative write trace section and the second positive write trace section are alternately arranged on the lower trace layer; the first positive write trace section is connected with the second positive write trace section via a first crossover, and the first negative write trace section is connected with the second negative write trace section via a second crossover.

16. The head gimbal assembly according to claim 12, wherein the positive write trace is separated into three positive write trace sections which comprises a first, second and third positive write trace section; the negative write trace is separated into three negative write trace sections which comprises a first, second and third negative write trace section.

17. The head gimbal assembly according to claim 16, wherein the first positive write trace section, the second negative write trace section and the third positive write trace section are alternately arranged on the upper trace layer, and the first negative write trace section, the second positive write trace section and the third negative write trace section are alternately arranged on the lower trace layer; the first, second and third positive write trace sections are connected in turn via two crossovers, and the first, second and third negative write trace sections are connected in turn via two crossovers.

18. The head gimbal assembly according to claim 17, wherein the total length of the first and third positive write trace sections and the total length of the first and third negative write trace sections are equal to as that of the second positive write trace section and the second negative write trace section.

19. A disk drive unit, comprising:
a head gimbal assembly including a slider and a suspension that supports the slider;
a drive arm connected to the head gimbal assembly;
a series of disks; and
a spindle motor operable to spin the disks;
wherein the suspension comprises:
a flexure having a leading portion and a tailing portion opposite to the leading portion; and
a plurality of electrical traces formed above the flexure and extending from the leading portion to the tailing portion, the electrical traces with a multiple-layer structure comprising a positive write trace and a negative write trace;
wherein the positive write trace is divided into at least two positive write trace sections located at an upper trace layer and a lower trace layer respectively, and the negative write trace is divided into at least two negative write trace sections located at the upper trace layer and the lower trace layer respectively, each positive write trace section and each negative write trace section are alternately arranged along a longitudinal direction on both the upper trace layer and the lower trace layer, and the positive write trace sections at different layers are connected together via conductive crossovers formed between the upper trace layer and the lower trace layer, and the negative write trace sections are connected together via conductive crossovers formed between the upper trace and the lower trace layer;

wherein the total lengths of all positive write trace sections on the upper trace layer or on the lower trace layer are the same, and the total lengths of all negative write trace sections on the upper trace layer or on the lower trace layer are the same, such that the total distance for either positive signal propagating or negative positive signal propagating in the upper trace layer is equal to that in the lower trace layer.

* * * * *